United States Patent
Zuo et al.

(10) Patent No.: US 11,842,860 B2
(45) Date of Patent: Dec. 12, 2023

(54) INTEGRATED ELECTRONIC SWITCH AND POWER TOOL

(71) Applicant: Nanjing Chervon Industry Co., Ltd., Nanjing (CN)

(72) Inventors: Changwei Zuo, Nanjing (CN); Shubin Tong, Nanjing (CN); Yonghui Cheng, Nanjing (CN)

(73) Assignee: Nanjing Chervon Industry Co., Ltd., Nanjing (CN)

( * ) Notice: Subject to any disclaimer, the term of this patent is extended or adjusted under 35 U.S.C. 154(b) by 112 days.

(21) Appl. No.: 17/692,466

(22) Filed: Mar. 11, 2022

(65) Prior Publication Data

US 2022/0293358 A1  Sep. 15, 2022

(30) Foreign Application Priority Data

Mar. 11, 2021  (CN) .......................... 202110264558.0
Feb. 22, 2022  (CN) .......................... 202210160216.9
Feb. 22, 2022  (CN) .......................... 202210160232.8

(51) Int. Cl.
| | |
|---|---|
| *H01H 13/14* | (2006.01) |
| *B25F 5/00* | (2006.01) |
| *H01H 9/52* | (2006.01) |
| *H02K 7/14* | (2006.01) |
| *H05K 1/18* | (2006.01) |

(52) U.S. Cl.
CPC ............. *H01H 13/14* (2013.01); *B25F 5/001* (2013.01); *H01H 9/52* (2013.01); *H02K 7/145* (2013.01); *H05K 1/181* (2013.01); *H05K 2201/10053* (2013.01)

(58) Field of Classification Search
CPC ........ H01H 13/14; H02K 7/145; H05K 1/181; H05K 2201/10053
See application file for complete search history.

(56) References Cited

U.S. PATENT DOCUMENTS

2012/0074881 A1* 3/2012 Pant .......................... B25F 5/00
                                                             318/400.09
2012/0293103 A1* 11/2012 Forster .................... H02P 27/08
                                                             318/503

FOREIGN PATENT DOCUMENTS

| EP | 2688080 A2 | 1/2014 |
|---|---|---|
| EP | 2929986 A2 | 10/2015 |
| EP | 3588525 A1 | 1/2020 |
| WO | 2020/039628 A1 | 2/2020 |

\* cited by examiner

*Primary Examiner* — Sherman Ng
(74) *Attorney, Agent, or Firm* — Greenberg Traurig, LLP

(57) ABSTRACT

An integrated electronic switch includes an input unit and a circuit board. The input unit is configured to receive a drive signal output by a user. A sensing module for sensing the drive signal transmitted from the input unit, and a control module electrically connected to the sensing module are disposed on the circuit board, where the sensing module and the control module are disposed on a first side surface of the circuit board.

18 Claims, 16 Drawing Sheets

INTEGRATED ELECTRONIC SWITCH AND POWER TOOL

RELATED APPLICATION INFORMATION

This application claims the benefit under 35 U.S.C. § 119(a) of Chinese Patent Application No. 202110264558.0, filed on Mar. 11, 2021, Chinese Patent Application No. CN 202210160232.8, filed on Feb. 22, 2022, and Chinese Patent Application No. CN 202210160216.9, filed on Feb. 22, 2022, which applications are incorporated herein by reference in their entirety.

BACKGROUND

In recent years, the application of hand-held electric tools has become more and more popular. With the development of technology the design of the integrated electronic switch becomes smaller and smaller. The control circuit and the power switch circuit are integrated on the same PCB board, and the functions of on/off and speed regulation of the hand-held electric tools are achieved at the same time. Multi-function leads to complex structure, high cost and tedious assembly of the integrated electronic switch. Therefore, how to reasonably achieve the simple structure and assembly of the integrated electronic switch is an urgent problem to be solved at present.

SUMMARY

An integrated electronic switch is provided. The integrated electronic switch includes an input unit and a circuit board. The input unit is configured to receive a drive signal output by a user; a sensing module for sensing the drive signal transmitted from the input unit, and a control module electrically connected to the sensing module are disposed on the circuit board, where the sensing module and the control module are disposed on a first side surface of the circuit board.

In an example, the circuit board is provided with multiple switching elements, where the multiple switching elements are electrically connected to the control module.

In an example, the multiple switching elements are disposed on a second side surface of the circuit board.

In an example, the integrated electronic switch also includes a heat dissipation element disposed on the second side surface of the circuit board.

In an example, a heat conduction element configured to transmit heat generated on the multiple switching elements to the heat dissipation element is disposed between the heat dissipation element and the multiple switching elements.

In an example, the input unit includes a trigger and a sensing actuator, and the sensing actuator is provided with at least a power-on sliding blade and a speed-regulating sliding blade.

In an example, the sensing module is formed with a power-on sensing area and a speed-regulating sensing area; and when the integrated electronic switch works, the power-on sensing area is electrically connected to the power-on sliding blade, and the speed-regulating sensing area is electrically connected to the speed-regulating sliding blade.

In an example, the integrated electronic switch also includes a housing formed with accommodation space and the circuit board is at least partially located in the accommodation space.

In an example, the sensing module is disposed in the accommodation space, and the control module is disposed outside the accommodation space.

An integrated electronic switch is provided. The integrated electronic switch includes a housing, an input unit and a circuit board. The housing is formed with an accommodation space; an input unit configured to receive a drive signal output by a user. The circuit board is at least partially disposed in the accommodation space, and is further provided with multiple switching elements, and a sensing module for sensing the drive signal transmitted from the input unit, where the sensing module is disposed on a first side surface of the circuit board; and the multiple switching elements are disposed on a second side surface of the circuit board.

In an example, the circuit board includes at least a first portion and a second portion, where the first portion is located in the accommodation space, and the second portion is located outside the accommodation space and extends in a front-rear direction.

In an example, the sensing module is disposed on a first side surface of the circuit board; and the multiple switching elements are disposed on a second side surface of the circuit board.

In an example, the integrated electronic switch also includes a heat dissipation element disposed on the second side surface of the circuit board, and the heat dissipation element is fixedly mounted to the second portion of the circuit board.

In an example, the heat dissipation element and the multiple switching elements are disposed opposite to each other in a height direction; and a heat conduction element is disposed between the heat dissipation element and the multiple switching elements and is configured to transmit heat generated on the multiple switching elements to the heat dissipation element.

In an example, the integrated electronic switch also includes a control module electrically connected to the sensing module; and the control module is disposed on the first side surface of the circuit board.

In an example, the input unit includes a trigger and a sensing actuator, and the sensing actuator is provided with at least a power-on sliding blade and a speed-regulating sliding blade.

In an example, the sensing module is formed with an power-on sensing area and a speed-regulating sensing area; and when the integrated electronic switch works, the power-on sensing area is electrically connected to the power-on sliding blade, and the speed-regulating sensing area is electrically connected to the speed-regulating sliding blade.

DETAILED DESCRIPTION

Figure 1:
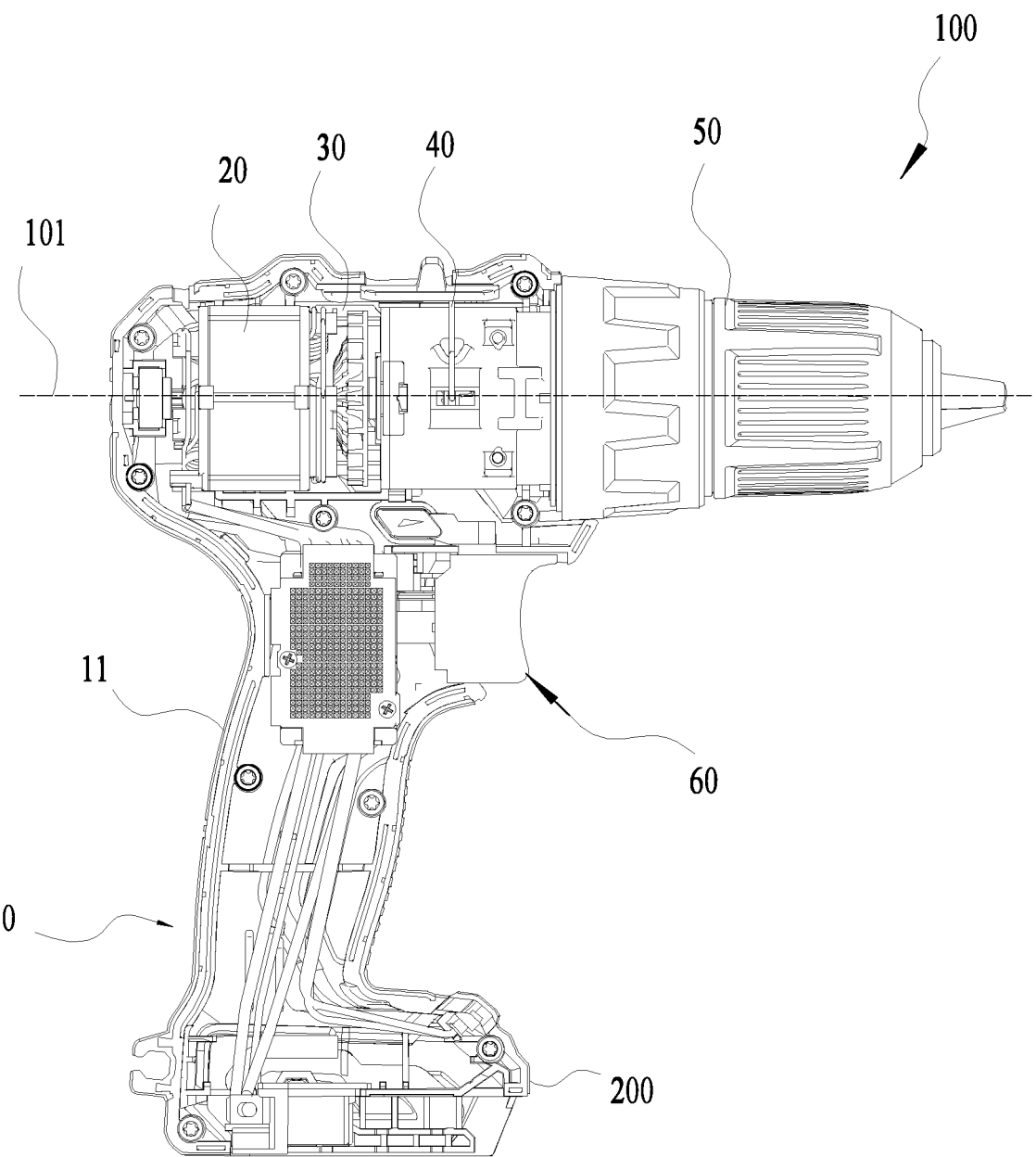
FIG. 1 is a structure view of a hand-held power tool as an example.

The present disclosure is described hereinafter in detail in conjunction with drawings and examples. This description is provided with reference to a drill shown in FIG. 1, but it is easily understood by those skilled in the art that the technical solution disclosed by the present disclosure can be widely applied to other types of power tools including, but not limited to, a sander, a drill bit, an impact screwdriver, a tapping machine, a fastener screwdriver and the like. The specific examples described below are intended to explain but not to limit the present disclosure. Additionally, it is to be noted that for ease of description, only part, not all, of the structures related to the present disclosure are illustrated in the drawings.

Referring to FIG. 1, the drill 100 includes a tool housing, a motor 20, a fan 30, a gearbox 40 and an output portion 50. The tool housing is formed with one handle 11 for a user to hold. One end of the handle 11 is connected to a power interface for accessing a direct current (DC) power supply or an alternating current (AC) power supply. In some examples, the power interface is connected to a battery pack 200 which is detachably connected to the drill 100. It is understandable that the power port can also be accessed to the alternating current, such as the commercial power. An accommodation space is formed in the tool housing along a first straight line 101, and the motor 20, the fan 30, and the gearbox 40 are sequentially disposed in the accommodation space. The drill 100 also includes an integrated electronic switch 60 for at least starting the operation of the motor 20 and adjusting a rotational speed of the motor 20.

FIGS. 2 to 5 illustrate an integrated electronic switch 60 as a first example in the present disclosure. The integrated electronic switch 60 includes an input unit 61, a housing 62, and a circuit board 63 located within the housing 62. The housing 62 includes a sealed accommodation space 623 formed by an upper housing 621 and a lower housing 622. The circuit board 63 is disposed in the accommodation space 623. The input unit 61 includes a trigger 611 and a sensing actuator 612. The sensing actuator 612 is provided with a power-on sliding blade 6121 and a speed-regulating sliding blade 6122. The user inputs a drive signal through the trigger 611. The drive signal includes a power signal and a speed-regulating signal, and the sensing actuator 612 and the trigger 611 are mechanically connected for transmitting the drive signal inputted by the user.

Figure 5:
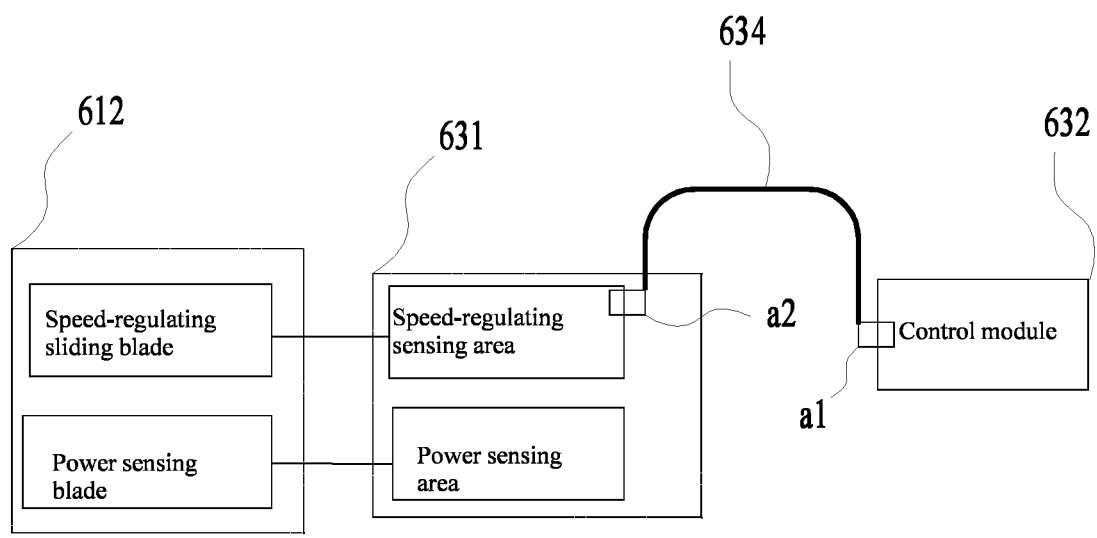
FIG. 5 is a schematic circuit diagram of an integrated electronic switch in FIG. 2.

The circuit board 63 is provided with a sensing module 631, a control module 632, and multiple switching elements 633. The control module 632 is electrically connected to the sensing module 631 and the multiple switching elements 633. The sensing module 631 is configured to sense the drive signal output by the input unit 61. The sensing module 631 includes a power-on sensing area 6311 and a speed-regulating sensing area 6312. When the user presses the trigger 611, the sensing actuator 612 drives the power-on sliding blade 6121 to slide in the power-on sensing area 6311 under the action of the trigger 611, and the speed-regulating sliding blade 6122 to slide in the speed-regulating sensing area 6312, and outputs an analog signal corresponding to the drive signal to the control module 632. The speed-regulating sensing area 6312 is provided with a signal output port a2 for outputting an analog signal corresponding to a speed-regulating signal input by the user, and the control module 632 is provided with one signal input port a1 for receiving the analog signal output from a signal output port a2. In some examples, as shown in FIG. 5, the signal input port a1 and the signal output port a2 are electrically connected through a jumper 634. A resistance may be connected in series between the signal input port a1 and the signal output port a2 for electrical connection through wiring on the circuit board.

Figure 3:
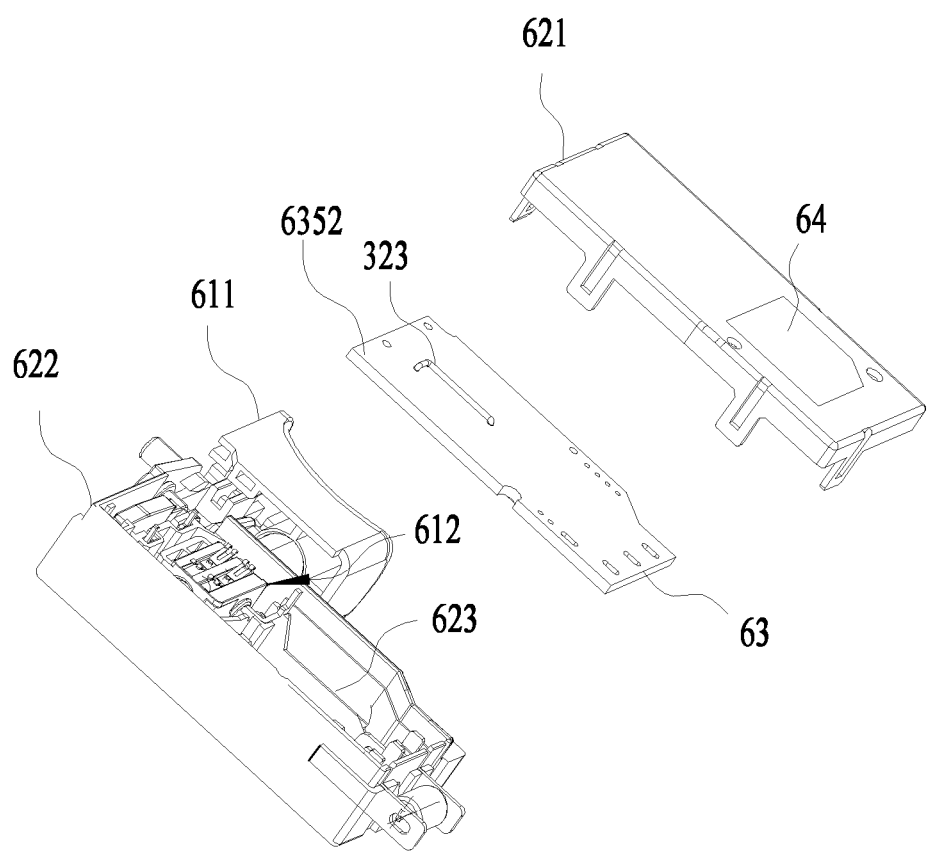
FIG. 3 is an exploded view of an integrated electronic switch in FIG. 2.
Figure 4:
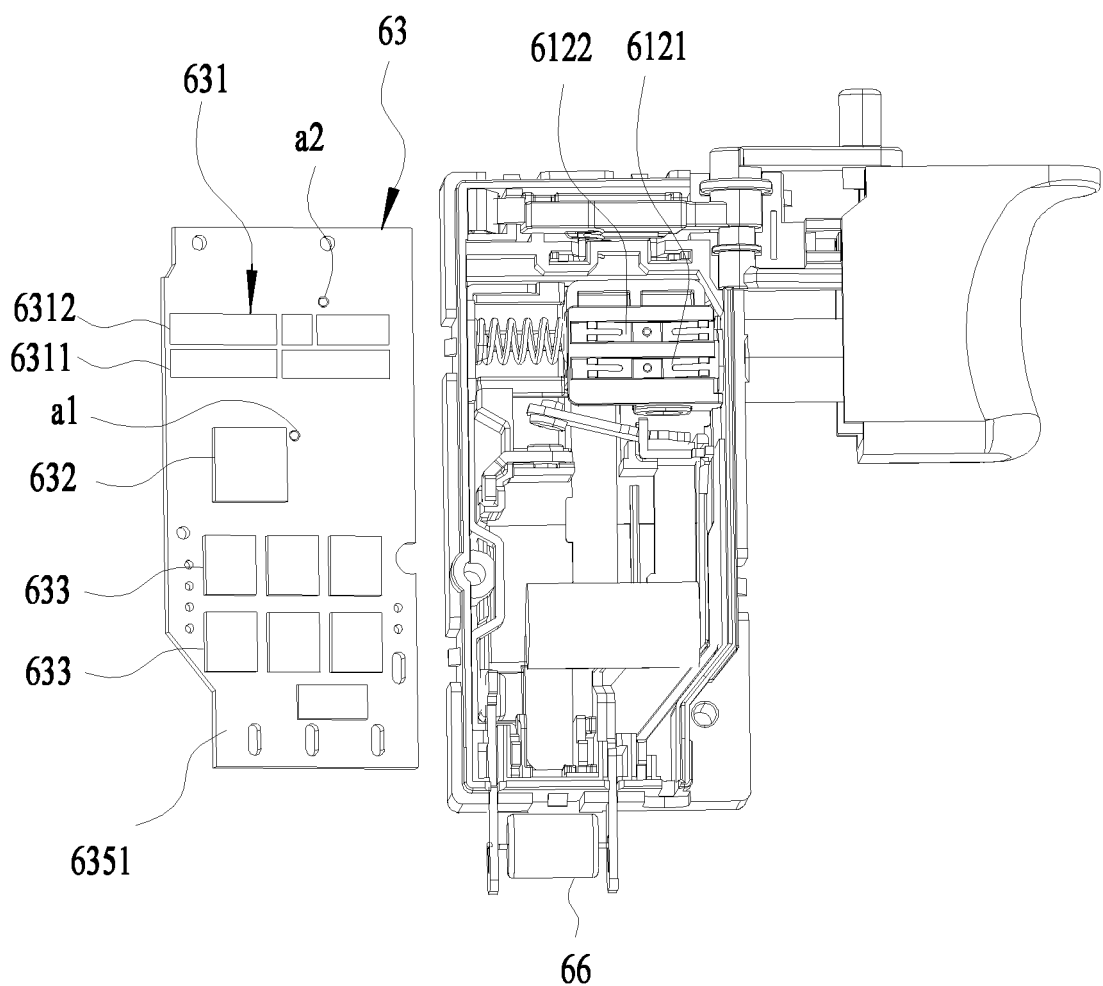
FIG. 4 is a structure view of an integrated electronic switch from another angle of view in FIG. 2.

Referring to FIGS. 3 and 4, the circuit board 63 has a first side surface 6351 and a second side surface 6352. In some examples, the sensing module 631, the control module 632 and multiple switching elements 633 are disposed on a same side surface of the circuit board 635. Specifically, the sensing module 631, the control module 632 and multiple switching elements 633 are disposed on the first side surface 6351 of the circuit board 63. In other examples, the sensing module 631 and the control module 632 are disposed on a same side surface of the circuit board 63. Specifically, the sensing module 631 and the control module 632 are disposed on the first side surface 6351 of the circuit board 63. The multiple switching elements 633 are disposed on the second side surface 6352 of the circuit board 63.

Figure 6:
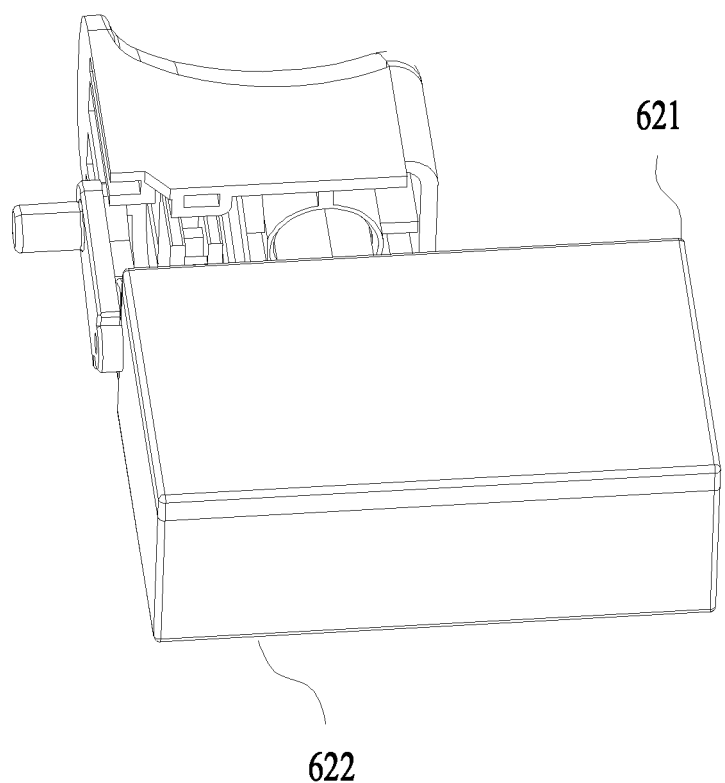
FIG. 6 is a structure view of an integrated electronic switch in FIG. 2 in which a heat dissipation element and an upper housing are integrally formed.

In this example, the integrated electronic switch 60 further includes a heat dissipation element 64 for heat dissipation of the circuit board 63. The heat dissipation element 64 is at least partially disposed outside the accommodation space 623. In some examples, the upper housing 621 is formed with a mounting groove disposed opposite to the multiple switching elements 633 in an up-down direction. The heat dissipation element 64 is embedded in the mounting groove. Preferably, the heat dissipation element 64 is configured to be a metal material having a good thermal conductivity. In other examples, referring to FIG. 6, the heat dissipation element 64 is integrally formed with the upper housing 621. It can be understood that when the heat dissipation element 64 is integrally formed with the upper housing 621 in this example, the upper housing 621 is preferably made of the metal material having a good thermal conductivity. Other materials having a good thermal conductivity or a heat absorption property may also be used by those skilled in the art to fabricate the housing, which is not limited in the present disclosure.

Figure 2:
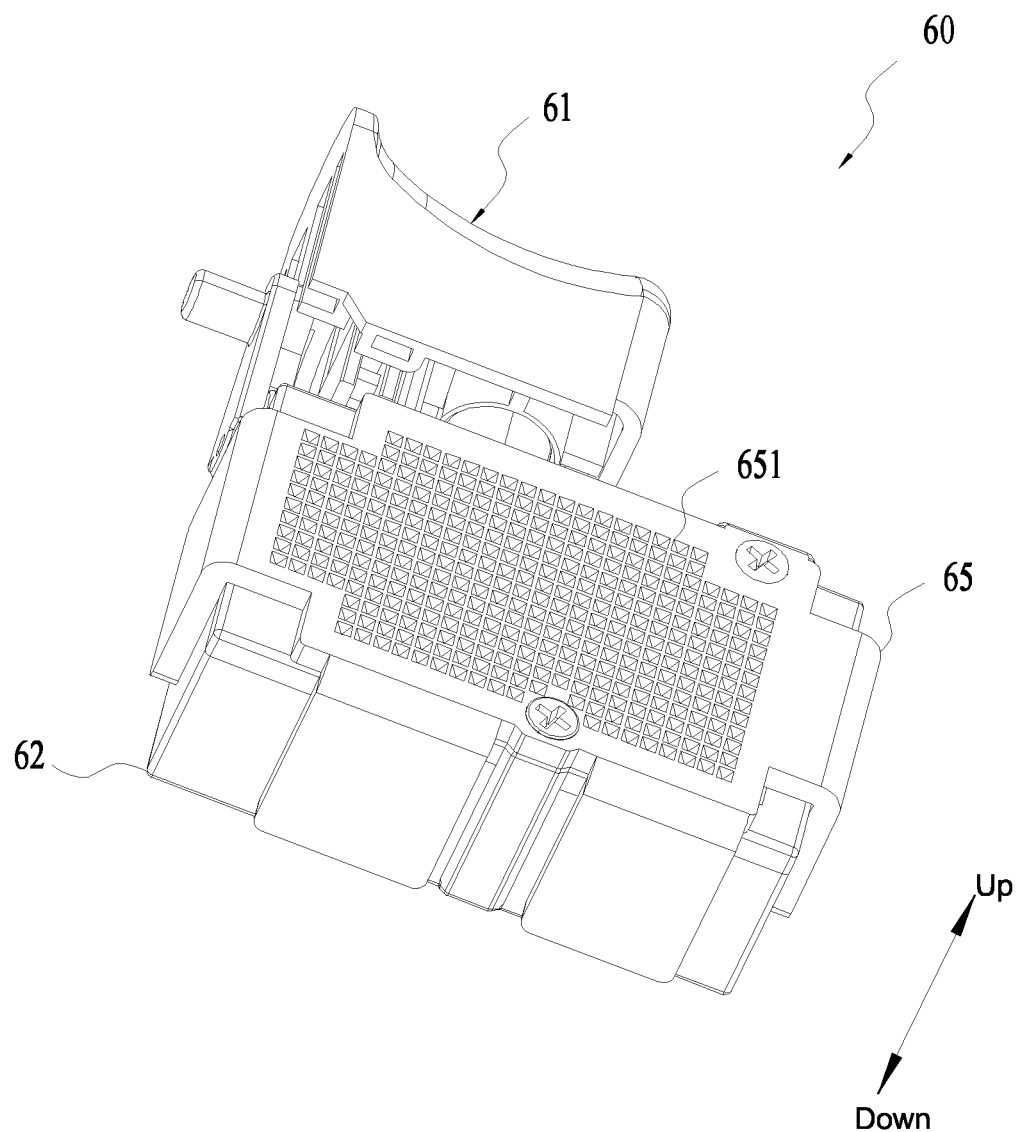
FIG. 2 is a structure view of an integrated electronic switch as a first example.

Referring to FIG. 2, the integrated electronic switch 60 further includes a metal housing 65 disposed on the housing 62. Specifically, the metal housing 65 is fixed to an outer surface of an upper housing 621 and directly or indirectly contacts with the heat dissipation element 64 on the upper housing 621 to derive heat from the heat dissipation element 64. In this example, the metal housing 65 is secured and mounted to the housing 62 by screws. To increase the heat dissipation area and enhance the heat dissipation effect, the metal housing 65 is further formed with a hollow grid-shaped heat dissipation area 651 so as to quickly transmit heat generated in the accommodation space 623 of the integrated electronic switch 60 to the outside of the accommodation space 623.

When the drill 100 works, more heat is generated on multiple switching elements 633 in the integrated electronic switch 60. The above heat is firstly transmitted to the heat dissipation element 64 and then to the metal housing 65 to be dissipated into the air.

Referring to FIG. 4, the integrated electronic switch 60 further includes a reverse diode 66 for providing a return path for a counter-electromotive force generated by the motor 20 when the integrated electronic switch 60 is started/stopped, preventing the counter-electromotive force generated by the motor 20 from returning to the battery pack 200. The reverse diode 66 is provided outside the housing 62 of the integrated electronic switch 60, a negative electrode of the reverse diode 66 is electrically connected to a positive electrode of a power input terminal, and a positive electrode of the reverse diode 66 is electrically connected to a negative electrode of the power input terminal. The reverse diode 66 may also be disposed on the circuit board 63 of the integrated electronic switch 60.

Figure 7:
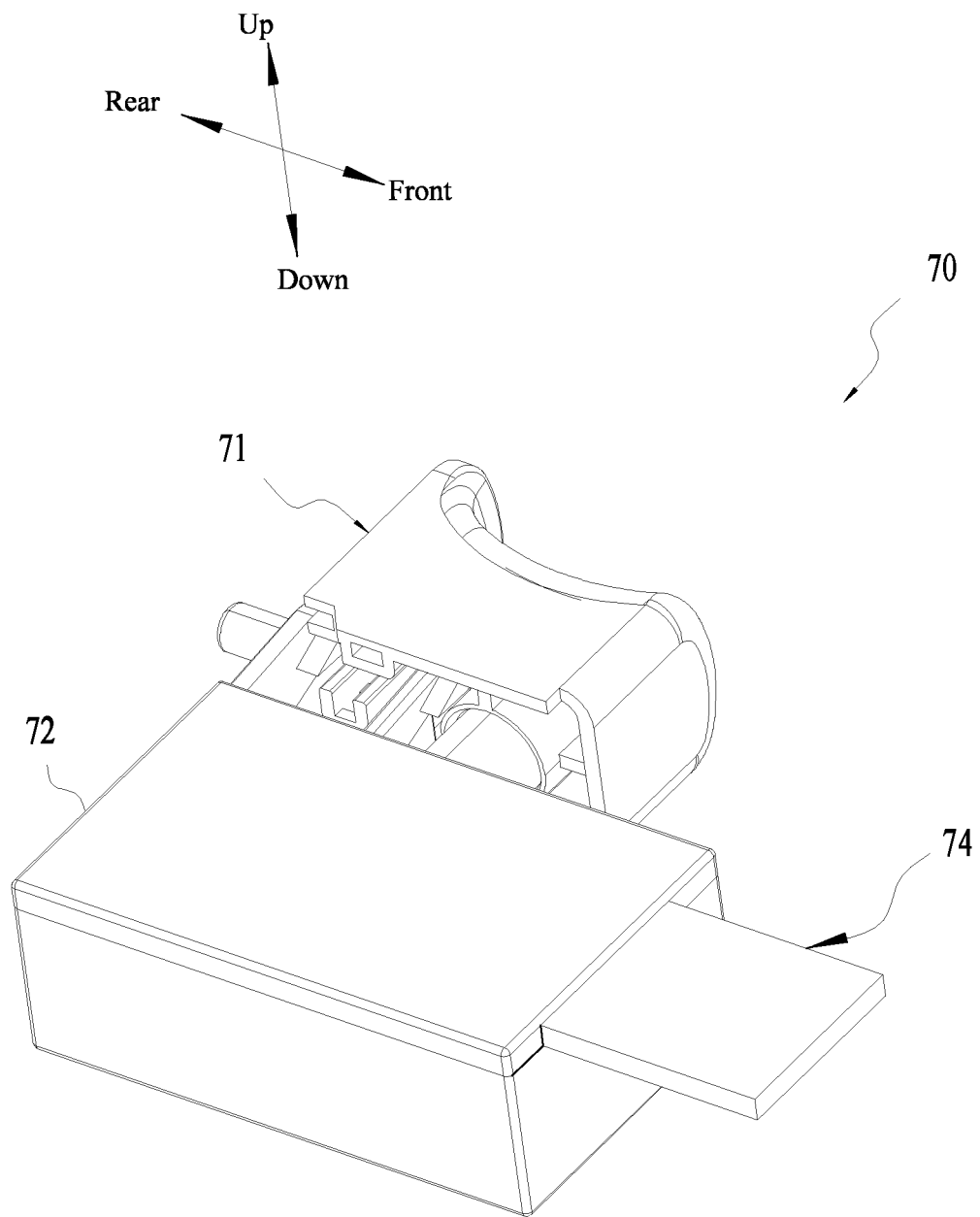
FIG. 7 is a structure view of an integrated electronic switch as a second example.
Figure 8:
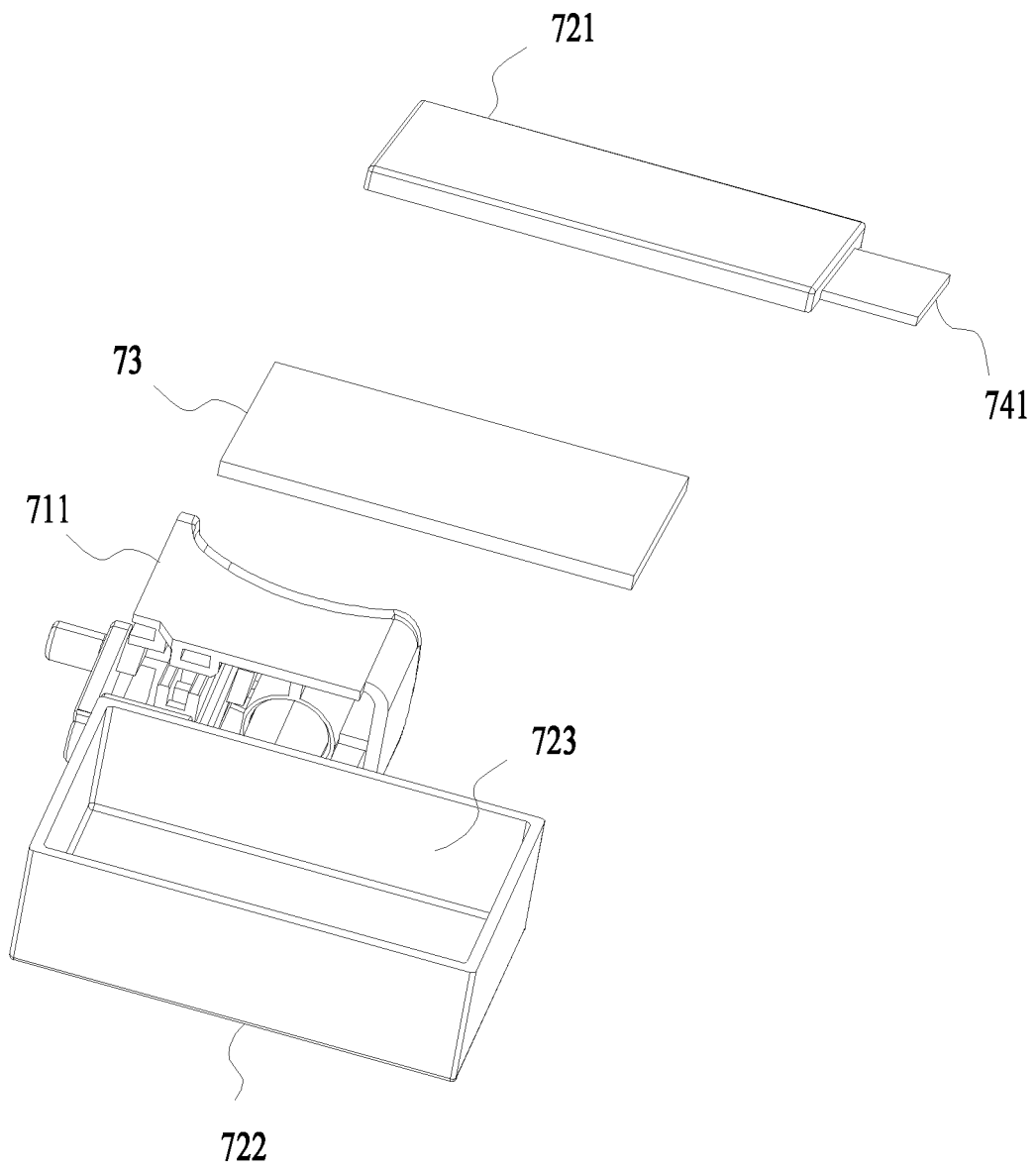
FIG. 8 is an exploded view of an integrated electronic switch in FIG. 7.

FIGS. 7 to 8 illustrate an integrated electronic switch 70 as a second example in the present disclosure. The integrated electronic switch 70 includes an input unit 71, a housing 72, and a circuit board 73 located within the housing 72. The housing 72 includes a sealed accommodation space 723 formed by an upper housing 721 and a lower housing 722. The circuit board 73 is disposed in the accommodation space 723. The input unit 71 includes a trigger 711 and a sensing actuator. The difference from the first example described above lies in that the heat dissipation element 74 includes a first heat dissipation portion located within the accommodation space 723 and a second heat dissipation portion 741 located outside the accommodation space 723. The first heat dissipation portion is arranged opposite to the multiple switching elements in an up-down direction, and is used for heat dissipation of the multiple switching elements. The first heat dissipation portion of the heat dissipation element 74 is fixed to the upper housing 721, and the second heat dissipation portion 741 extends outward in a front-rear direction.

In this example, the heat dissipation element 74 includes the first heat dissipation portion and the second heat dissipation portion 741 extending in the front-rear direction. The first heat dissipation portion is located in the accommodation space 723 and is disposed opposite to the multiple switching elements in the up-down direction. The second heat dissipation portion 741 is located outside the accommodation space 723 and is configured to rapidly dissipate the heat transmitted from the first heat dissipation portion to the air outside the accommodation space 723. The assembly difficulty of the integrated electronic switch 70 in this example is low, and at the same time, the structure of the integrated electronic switch 70 is simplified.

Figure 9:
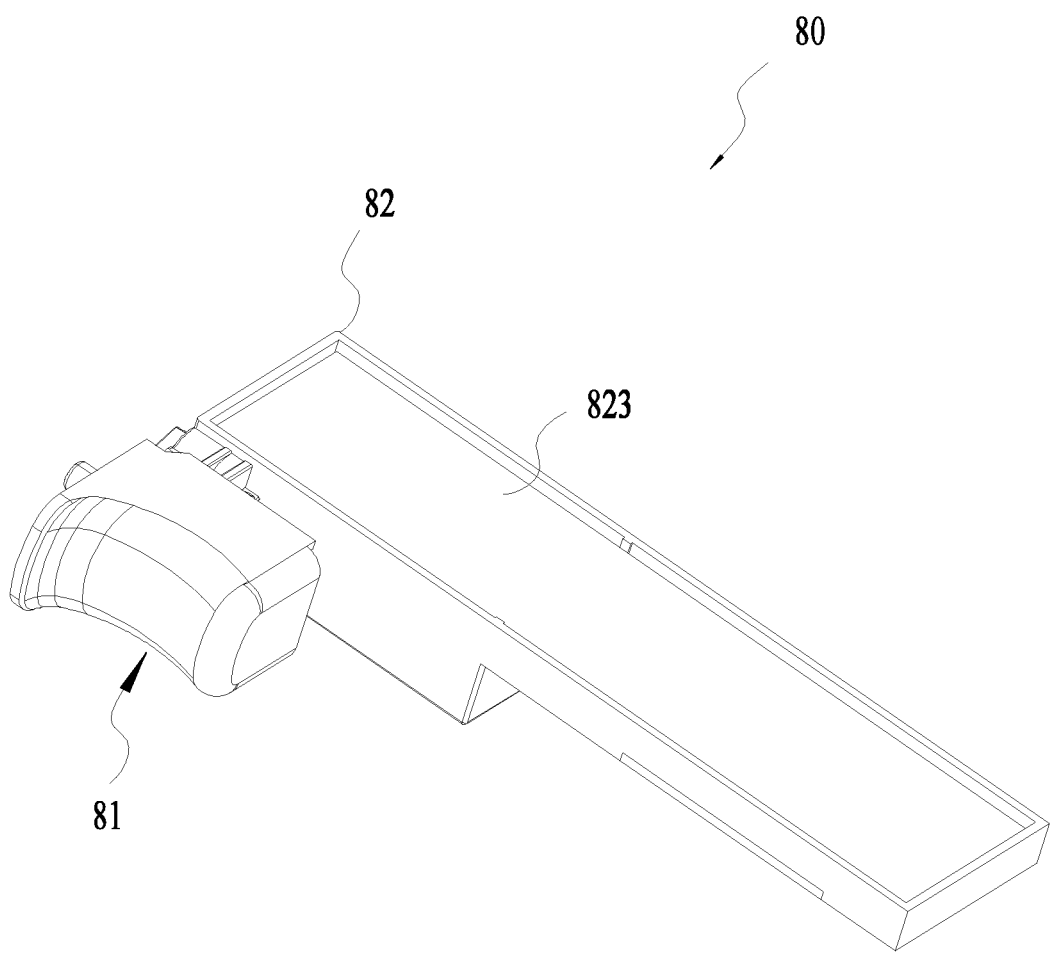
FIG. 9 is a structure view of an integrated electronic switch as a third example.
Figure 10:
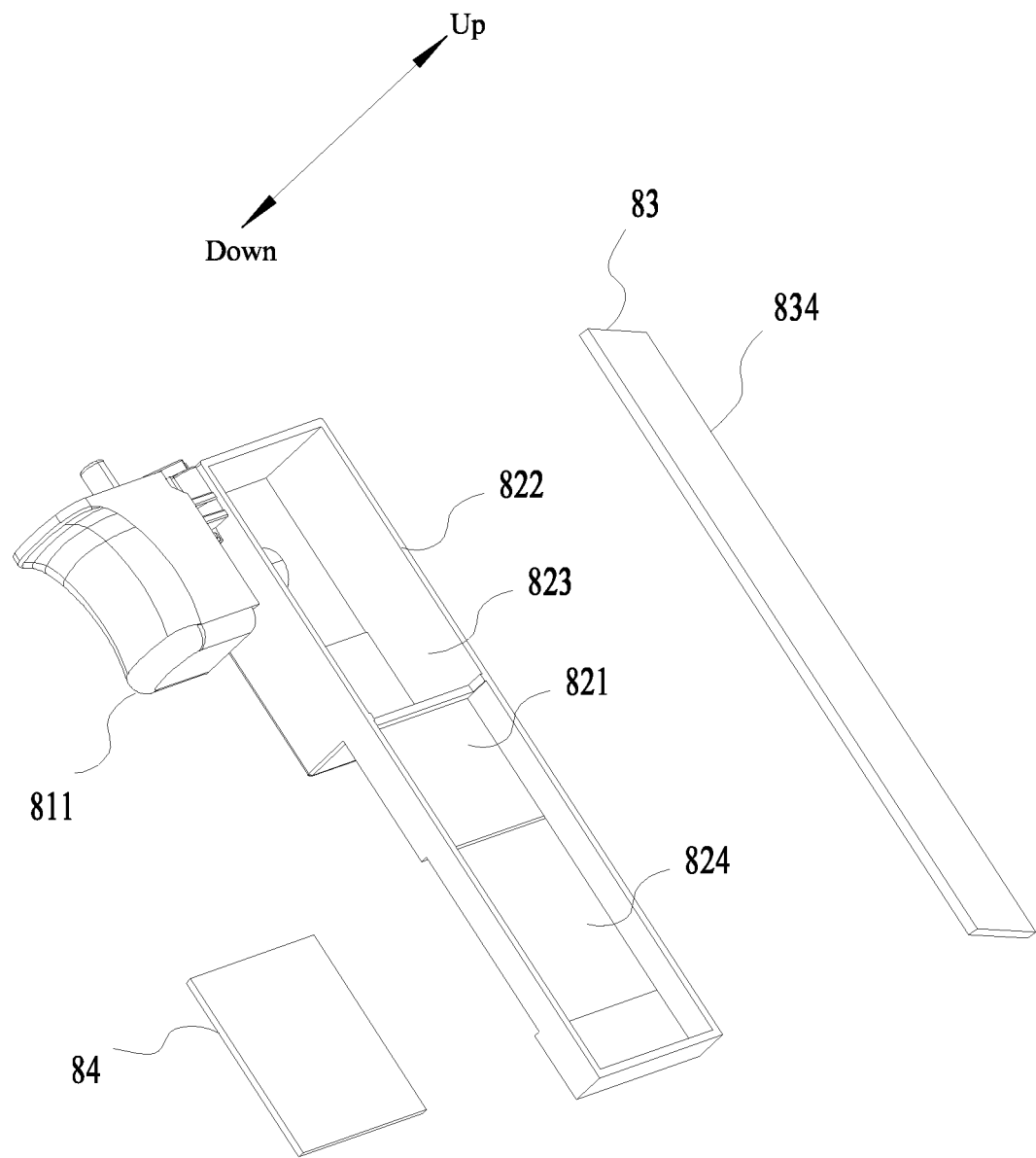
FIG. 10 is an exploded view of an integrated electronic switch in FIG. 9.
Figure 11:
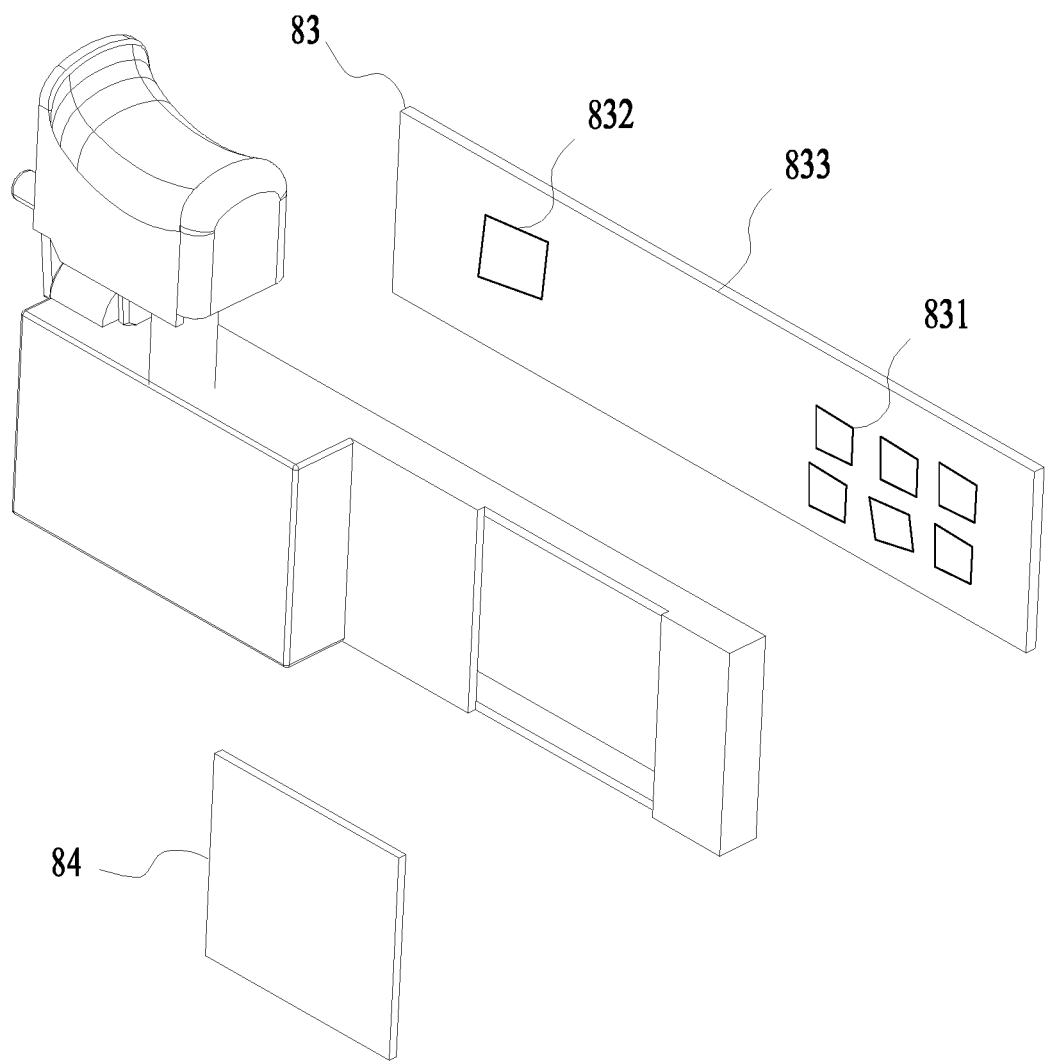
FIG. 11 is an exploded view of an integrated electronic switch from another angle of view in FIG. 9.

FIGS. 9 to 11 illustrates an integrated electronic switch 80 as a third example in the present disclosure. The integrated electronic switch 80 includes an input unit 81, a housing 82, and a circuit board 83 located within the housing 82. The input unit 81 includes a trigger 811 and a sensing actuator. The housing 82 includes a housing bottom 821 and a housing side 822. The housing bottom 821 and the housing side 822 form an open cavity 823. The circuit board 83 is disposed in the open cavity 823. The circuit board 83 is provided with multiple switching elements 831 and a control module 832. The housing bottom 821 has one heat dissipation hole 824 disposed opposite to the multiple switching elements 831 in the up-down direction. The integrated electronic switch 80 further includes one cooling fin 84 disposed opposite to the multiple switching elements in a height direction. Preferably, multiple switching elements 831 are disposed on a first side surface 833 of the circuit board 83. The control module 832 is disposed on the first side surface 833 of the circuit board 83. The cooling fin 84 is partially located in the heat dissipation hole 824. A second side surface 834 of the circuit board 83 is sealed through a glue filling process.

Figure 12:
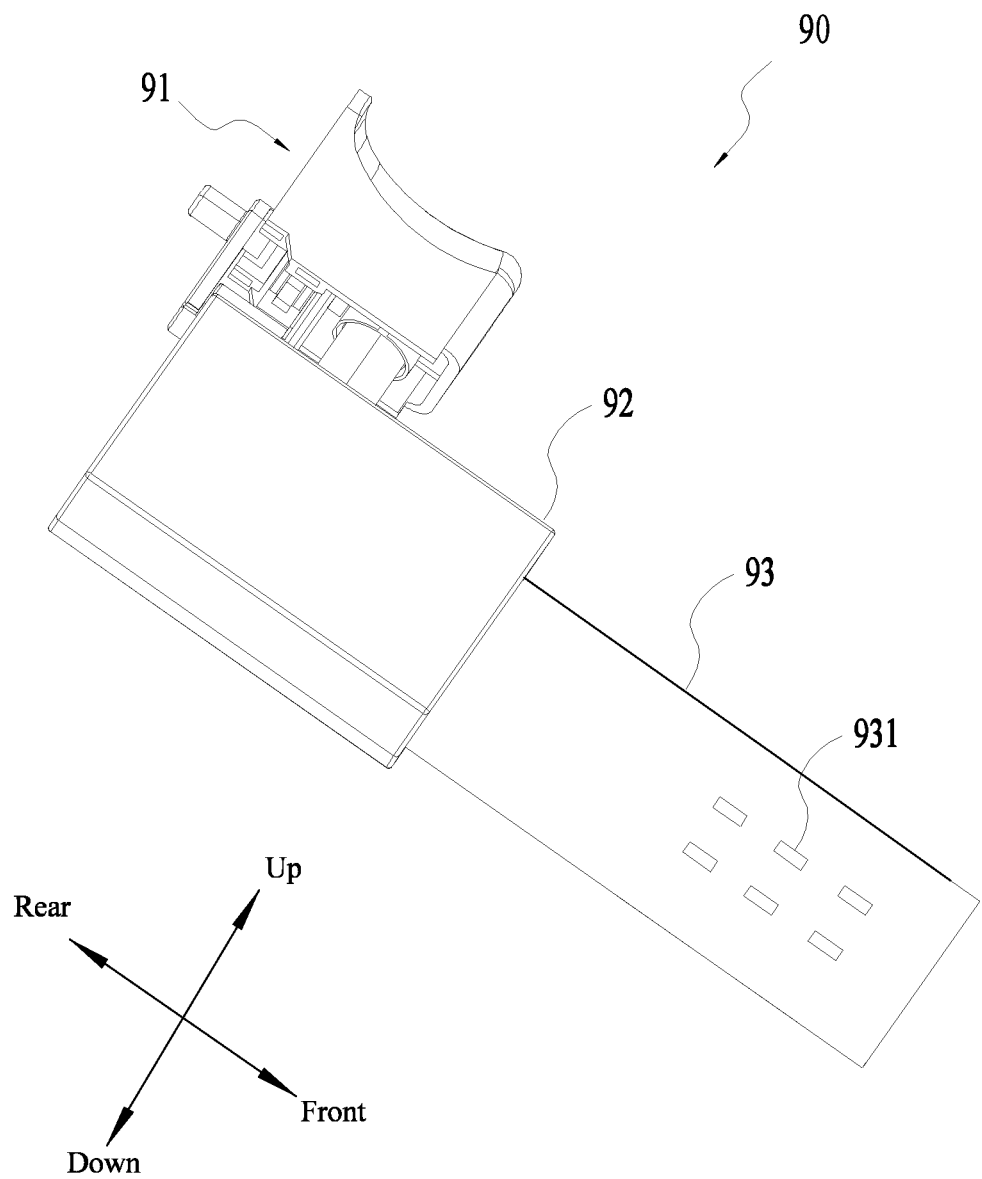
FIG. 12 is a structure view of an integrated electronic switch as a fourth example.
Figure 13:
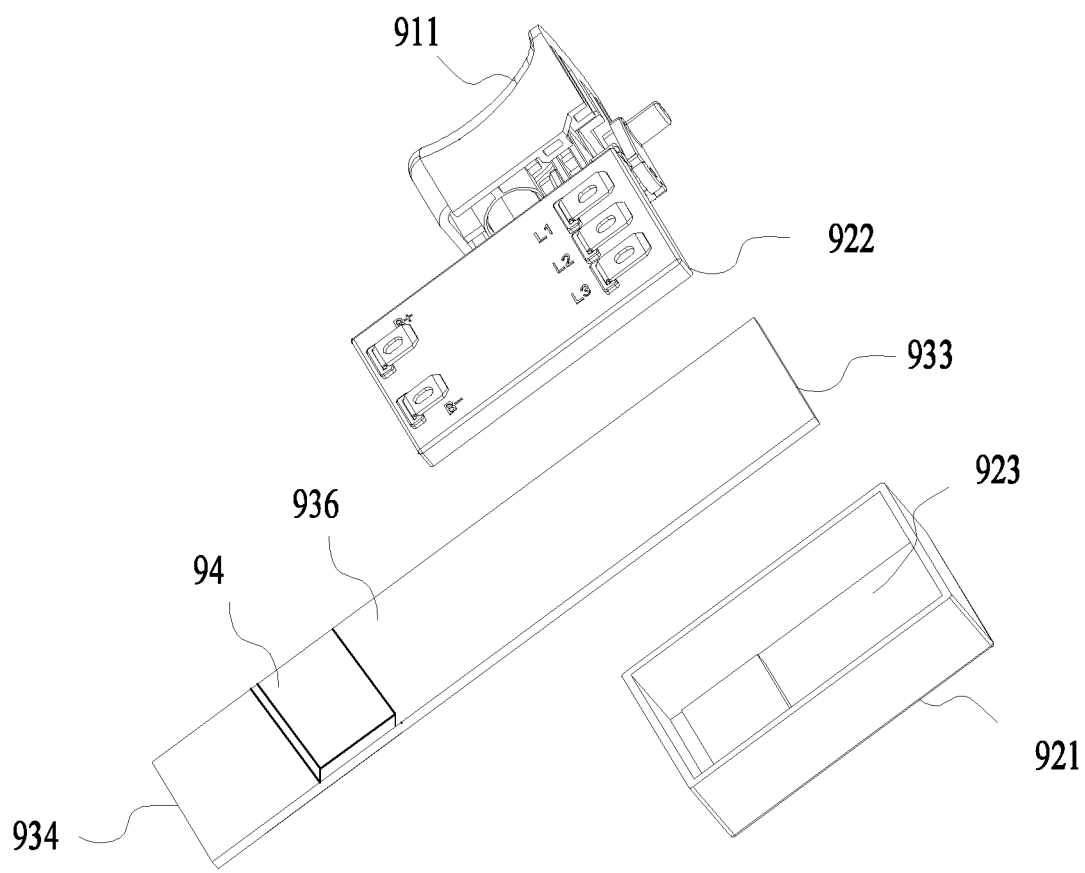
FIG. 13 is an exploded view of an integrated electronic switch in FIG. 12.
Figure 14:
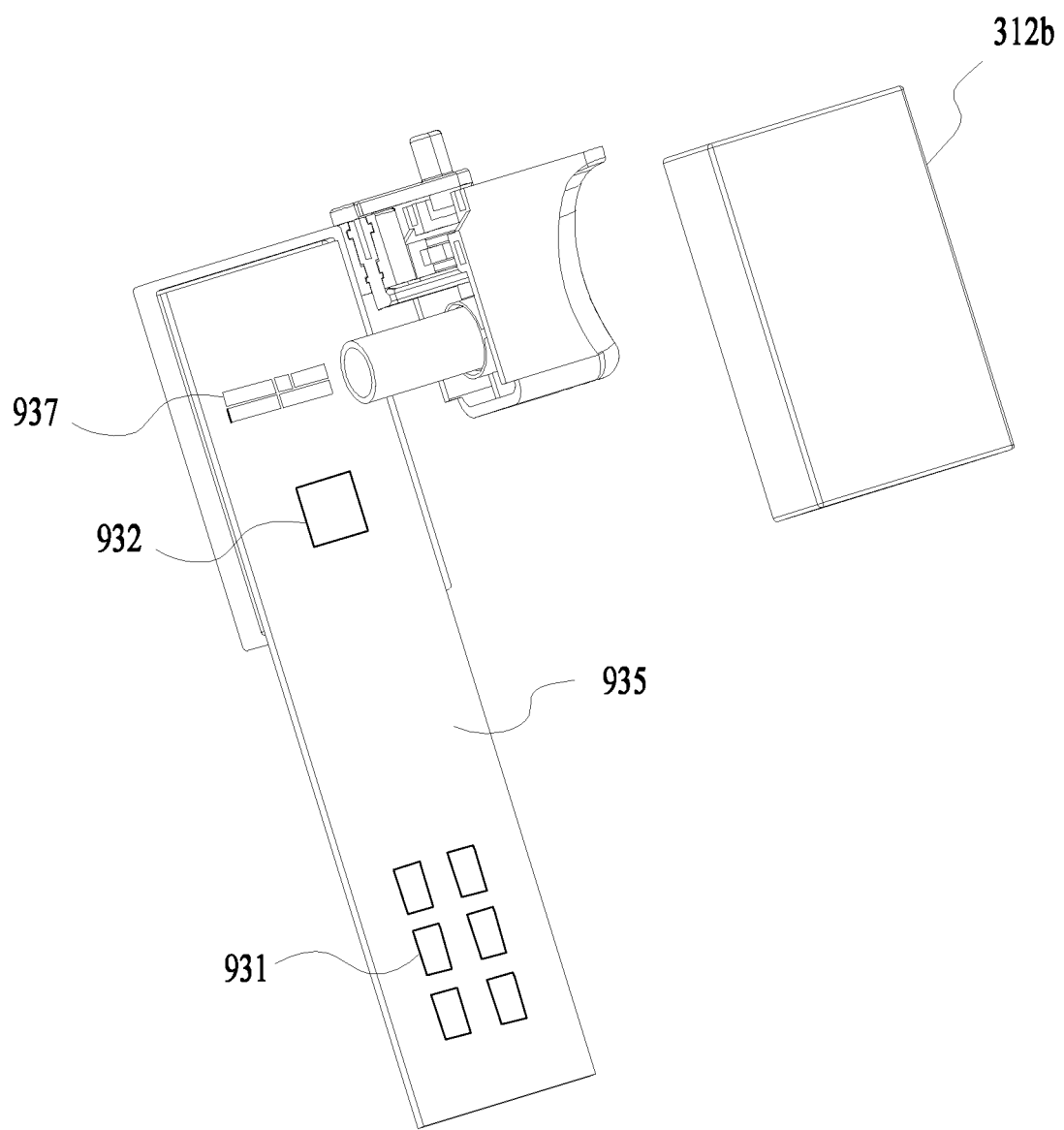
FIG. 14 is an exploded view of an integrated electronic switch from another angle of view in FIG. 12.

FIGS. 12 to 14 illustrates an integrated electronic switch 90 as a fourth example in the present disclosure. The integrated electronic switch 90 includes an input unit 91, a housing 92, and a circuit board 93 located within the housing 92. The input unit 91 includes a trigger 911 and a sensing actuator. The housing 92 includes an upper housing 921 and a lower housing 922, and the upper housing 921 and the lower housing 922 are formed with an accommodation space 923. The circuit board 93 includes a first portion 933 located inside the accommodation space 923 and a second portion 934 located outside the accommodation space 923 extending in a front-rear direction. The circuit board 93 is further provided with multiple switching elements 931, a control module 932, and a sensing module 937. Further, the control module 932 and the sensing module 937 are disposed in the first portion 933 of the circuit board 93, and multiple switching elements 931 are disposed in the second portion 934 of the circuit board 93.

In this example, as one possible implementation mode, multiple switching elements 931, the control module 932, and the sensing module 937 are disposed on a same side surface of the circuit board 93. Preferably, multiple switching elements 931 are disposed on the first side surface 935 in the second portion 934 of the circuit board 93. The control module 932 and the sensing module 937 are disposed on the first side surface 935 in the first portion 933 of the circuit board 93. The integrated electronic switch 90 in this example further includes a heat dissipation element 94 disposed opposite to the multiple switching elements 931 in an up-down direction. The heat dissipation element 94 and the multiple switching elements 931 are located on both sides of the circuit board 93. In this example, the heat dissipation element 94 is disposed on the second side surface 936 of the circuit board 93. The heat dissipation element 94 may also be disposed on a surface of the multiple switching elements 931. Specifically, a heat conductive member is disposed between the heat dissipation element 94 and the multiple switching elements 931, and heat from the multiple switching elements 931 is transmitted to the heat dissipation element 94 by the heat conductive member so as to dissipate the heat from the integrated electronic switch 90.

Figure 15:
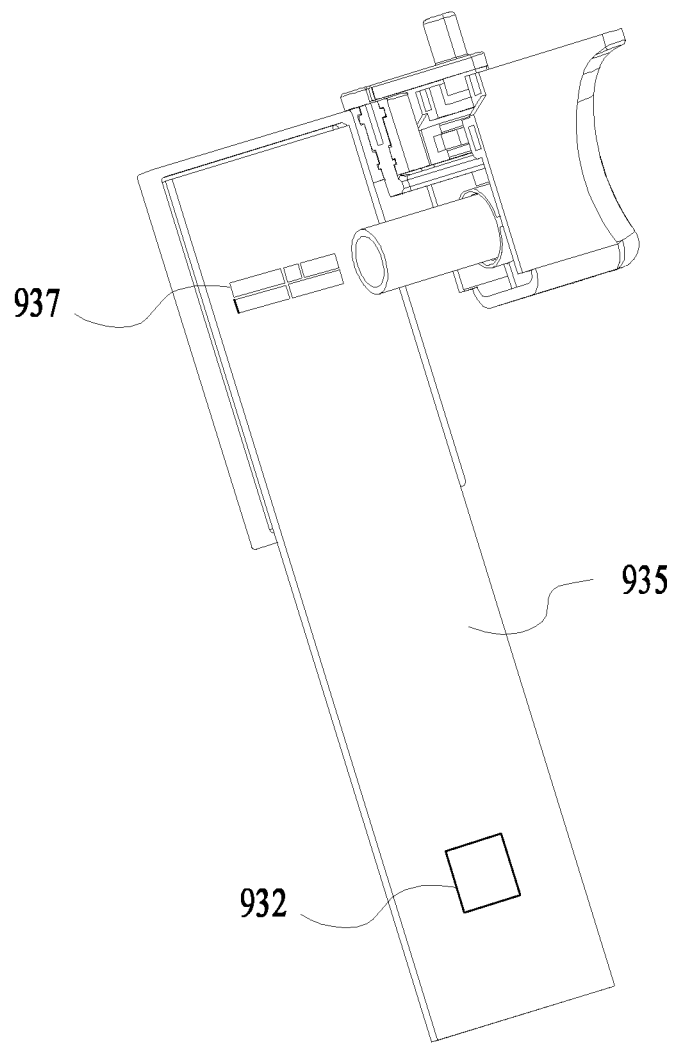
FIG. 15 is a structure view of an integrated electronic switch in FIG. 12 according to another example.
Figure 16:
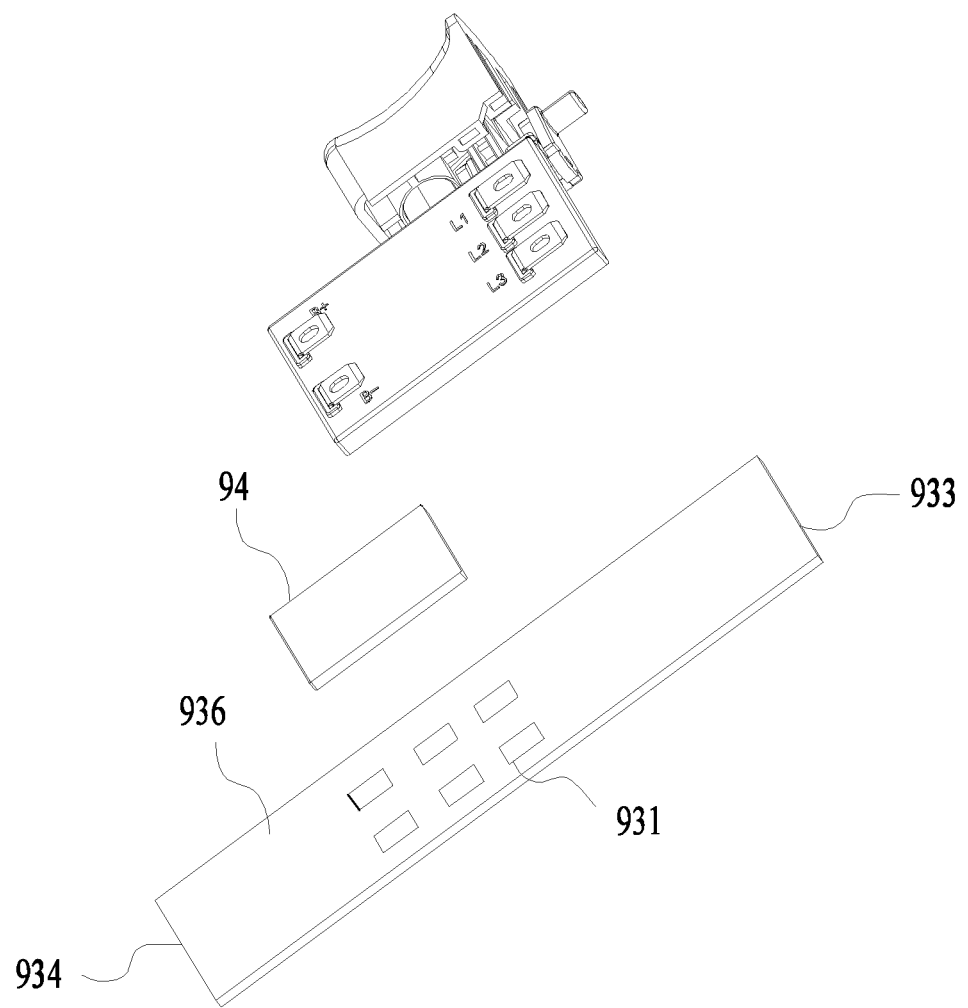
FIG. 16 is an exploded view of an integrated electronic switch in FIG. 15.

As another possible implementation mode, as shown in FIGS. 15 and 16, the sensing module 937 is disposed in the first portion 933 of the circuit board 93, and the control module 932 and the multiple switching elements 931 are disposed in the second portion 934 of the circuit board 93. The sensing module 937 and the control module 932 are located on the same side surface of the circuit board 93, and the heat dissipation element 94 and the multiple switching elements 931 are located on another side surface of the circuit board 93. Specifically, the sensing module 937 and the control module 932 are disposed on the first side surface 935 of the circuit board 93, and multiple switching elements 931 and the heat dissipation element 94 are disposed on the second side surface 936 of the circuit board 93. In this example, the heat dissipation element 94 is secured and mounted to the circuit board 93 by screws.

In this example, the circuit board is configured to be two portions. The first portion of the circuit board is disposed in the accommodation space, and the second portion of the circuit board is disposed outside the accommodation space. Multiple switching elements which are easy to generate the heat in the working process of the integrated electronic switch are disposed in the second portion of the circuit board, and at the same time, the heat dissipation element is disposed opposite to the multiple switching elements in the up-down direction for deriving the heat generated by the multiple switching elements. The present disclosure gives more selection space for the position of the heat dissipation element on the integrated electronic switch, and simultaneously reduces the assembly difficulty of the integrated electronic switch.

The above illustrates and describes basic principles, main features, and advantages of the present disclosure. It is to be understood by those skilled in the art that the preceding examples do not limit the present disclosure in any form, and technical solutions obtained by means of equivalent substitution or equivalent transformation fall within the scope of the present disclosure.

What is claimed is:

1. An integrated electronic switch, comprising: an input unit configured to receive a drive signal output by a user; a sensing module for sensing the drive signal transmitted from the input unit; a circuit board for supporting the sensing module; and a control module electrically connected to the sensing module and disposed on the circuit board; wherein the sensing module and the control module are disposed on a first side surface of the circuit board, further comprising a housing formed with an accommodation space, wherein the circuit board comprises a first portion located inside the accommodation space and a second portion located outside the accommodation space.

2. The integrated electronic switch of claim 1, wherein the circuit board is provided with a plurality of switching elements and the plurality of switching elements are electrically connected to the control module.

3. The integrated electronic switch of claim 2, wherein the plurality of switching elements are disposed on a second side surface of the circuit board and the second side surface is opposite to the first side surface.

4. The integrated electronic switch of claim 3, wherein the integrated electronic switch further comprises a heat dissipation element disposed on the second side surface of the circuit board.

5. The integrated electronic switch of claim 4, wherein a heat conduction element configured to transmit heat generated on the plurality of switching elements to the heat dissipation element is disposed between the heat dissipation element and the plurality of switching elements.

6. The integrated electronic switch of claim 1, wherein the input unit comprises a trigger and a sensing actuator and the sensing actuator is provided with a power-on sliding blade and a speed-regulating sliding blade.

7. The integrated electronic switch of claim 6, wherein the sensing module is formed with a power-on sensing area and a speed-regulating sensing area, and the power-on sensing area is electrically connected to the power-on sliding blade and the speed-regulating sensing area is electrically connected to the speed-regulating sliding blade when the integrated electronic switch works.

8. The integrated electronic switch of claim 1, further comprising a housing formed with an accommodation space, wherein the circuit board is at least partially located in the accommodation space.

9. The integrated electronic switch of claim 8, wherein the sensing module is disposed in the accommodation space and the control module is disposed outside the accommodation space.

10. The integrated electronic switch of claim 1, wherein the sensing module is disposed on the first portion of the circuit board, and the control module is disposed on the second portion of the circuit board.

11. The integrated electronic switch of claim 10, wherein the circuit board is provided with a plurality of switching elements, the plurality of switching elements are electrically connected to the control module, and the plurality of switching elements are disposed on the second portion of the circuit board.

12. The integrated electronic switch of claim 11, further comprising a heat dissipation element for dissipating heat from the switching element.

13. The integrated electronic switch of claim 12, wherein the heat dissipation element is located at least partially outside the accommodation space.

14. The integrated electronic switch of claim 1, wherein the circuit board is provided with a plurality of switching elements, the plurality of switching elements are electrically connected to the control module, and the plurality of switching elements are disposed on the first side surface of the circuit board.

15. A power tool, comprising: a tool housing; a motor, disposed in the tool housing; and an integrated electronic switch for starting the operation of the motor and adjusting a rotational speed of the motor; wherein the integrated electronic switch comprises: an input unit configured to receive a drive signal output by a user; a sensing module for sensing the drive signal transmitted from the input unit; a circuit board for supporting the sensing module; and a control module electrically connected to the sensing module and disposed on the circuit board; and wherein the sensing module and the control module are disposed on a first side surface of the circuit board, further comprising a housing formed with an accommodation space, wherein the circuit board comprises a first portion located inside the accommodation space and a second portion located outside the accommodation space.

16. An integrated electronic switch, comprising: a housing formed with an accommodation space; an input unit configured to receive a drive signal output by a user; a sensing module for sensing the drive signal transmitted from the input unit; a circuit board for supporting the sensing module; and a plurality of switching elements; wherein the sensing module is disposed on a first side surface of the circuit board and the plurality of switching elements are disposed on a second side surface of the circuit board, wherein the circuit board comprises a first portion and a second portion, the first portion is located in the accommodation space, and the second portion is located outside the accommodation space.

17. The integrated electronic switch of claim 16, wherein the sensing module is disposed on the first portion of the circuit board and the plurality of switching elements are disposed on the second portion of the circuit board.

18. The integrated electronic switch of claim 17, further comprising a heat dissipation element disposed on the second side surface of the circuit board, wherein the heat dissipation element is fixedly mounted to the second portion of the circuit board.

\* \* \* \* \*